(12) United States Patent
Reichard

(10) Patent No.: US 6,472,613 B1
(45) Date of Patent: Oct. 29, 2002

(54) LOW-INDUCTANCE CONNECTOR FOR PRINTED-CIRCUIT BOARD

(75) Inventor: Jeffrey A. Reichard, Oconomowoc, WI (US)

(73) Assignee: American Superconductor Corporation, Westborough, MA (US)

( * ) Notice: Subject to any disclaimer, the term of this patent is extended or adjusted under 35 U.S.C. 154(b) by 0 days.

(21) Appl. No.: 09/677,097

(22) Filed: Sep. 29, 2000

(51) Int. Cl.[7] .......................... H05K 12/04; H05K 1/00; H05K 1/11; H01R 12/16; H03H 7/38
(52) U.S. Cl. ...................... 174/261; 361/790; 361/784; 361/803; 333/32; 174/250; 174/260
(58) Field of Search ................................ 174/250, 260, 174/261; 361/784, 790, 803; 333/22

(56) References Cited

U.S. PATENT DOCUMENTS

| | | | | |
|---|---|---|---|---|
| 4,686,492 A | * | 8/1987 | Grellmann et al. | ............ 333/33 |
| 4,899,251 A | | 2/1990 | Imai et al. | ................... 361/346 |
| 4,904,968 A | * | 2/1990 | Theus | ........................ 333/246 |
| 5,036,431 A | * | 7/1991 | Adachi et al. | .............. 361/412 |
| 5,576,519 A | * | 11/1996 | Swamy | ....................... 174/265 |
| 5,751,555 A | | 5/1998 | Pfizenmayer et al. | ....... 361/763 |
| 5,864,092 A | * | 1/1999 | Gore et al. | ................. 174/52.4 |

FOREIGN PATENT DOCUMENTS

| | | | | |
|---|---|---|---|---|
| DE | 9403108 | | 4/1994 | ........... H01L/25/11 |
| EP | 0287681 | | 10/1988 | ............ H05K/3/46 |
| JP | 63157677 | | 6/1988 | ........ H02M/7/5387 |
| JP | 8274428 | | 10/1996 | ............ H05K/1/02 |
| JP | 09135565 | | 5/1997 | ............ H02M/1/00 |
| JP | 2000200948 | | 7/2000 | ............ H05K/1/02 |

OTHER PUBLICATIONS

International Search Report issued Feb. 20, 2002 by EPO.

* cited by examiner

Primary Examiner—Albert W. Paladini

(57) ABSTRACT

A low-inductance connection between a first component and a second component on a first surface of a first printed-circuit board includes a second conducting path in electrical communication with a first conducting path that connects the first and second components. The second conducting path is disposed on a surface separated from the first surface of the first printed-circuit board and separated from the first printed-circuit board by an insulating layer. An electrical connector extends between the first conducting path and the second conducting path and provides electrical communication between them. The first and second conducting paths thus cooperate to provide an electrical connection having a parasitic inductance that is smaller than the parasitic inductance of the first conducting path.

52 Claims, 5 Drawing Sheets

LOW-INDUCTANCE CONNECTOR FOR PRINTED-CIRCUIT BOARD

FIELD OF INVENTION

This invention relates to printed-circuit board assemblies and in particular, to structures for electrically connecting components with a minimum of parasitic inductance.

BACKGROUND

A single-sided printed-circuit board generally consists of a fiberglass substrate having a component-side and a solder-side. On the solder-side, conducting paths are imprinted or deposited. On the component side, various electrical components are mounted and connected to the conducting paths on the solder-side through strategically located through holes.

It is well-known in electromagnetic theory that a current on a conducting path will support a magnetic field. It is also well-known that a magnetic field abhors change. When the current that supports it is suddenly removed, a magnetic field will attempt to restore the status-quo by expending some of its own stored energy to cause the flow of an induced current to replace the current that was suddenly taken away. Because the magnetic field has only finite energy stored within it, this attempt is doomed to failure. Nevertheless, the magnetic field's attempt to survive causes difficulty in a high-power switching circuit in which one would like to turn current on and off immediately.

The magnetic field's propensity to resist change by inducing current in a conducting path is measured by inductance of that path. Because of its undesirable effect, this inductance is often referred to as a "parasitic inductance." The inductance of a conducting path depends in part on the geometry of the path. In particular, by widening the conducting path one can reduce its parasitic inductance. However, in a printed-circuit board, there are practical limits to how wide a conducting path can be. As a conducting path becomes wider, portions of it necessarily become closer to other conducting paths and components on the same board.

Although it is possible to circumvent the foregoing difficulty by simply enlarging the printed-circuit board, this solution has several disadvantages. A larger printed-circuit board, particularly one large enough to accommodate several transistor modules in a power-switching circuit, is more expensive. In addition, a larger printed-circuit board undergoes greater deformation when placed under tension or compression or when thermally stressed. These deformations can weaken soldered connections on the printed-circuit board.

SUMMARY

The invention provides a low-inductance connection between a first component and a second component on a first printed-circuit board by expanding into a third dimension and providing a second, auxiliary conducting path on a surface separate from the first printed-circuit board. This separate surface is spaced apart from the first printed-circuit board and therefore does not occupy additional area on that printed-circuit board.

The low-inductance connection includes a first conducting path disposed on a first surface of the first printed-circuit board and extending between the first component and the second component. The connection also includes a second conducting path disposed on a separate surface that is separated from the first printed-circuit board. The second conducting path is in electrical communication with the first conducting path. The first and second conducting paths thus cooperate to effectively act as a wide conducting path having a lower parasitic inductance than that of the first conducting path acting by itself.

Typically, the second conducting path is disposed on a second printed-circuit board having a proximal surface facing the first printed-circuit board and a distal surface opposite the proximal surface. The surface on which the second conducting path is disposed can be the distal or proximal surface of the second printed-circuit board. Alternatively, the second conducting path can be disposed on a second surface of the first printed-circuit board.

The insulating layer between the first and second conducting paths can be an air-filled gap or a gap filled by an insulating gas. Alternatively, the insulating layer can be a layer of a dielectric material. When the second conducting path is disposed on the distal surface of the second printed-circuit board, the dielectric material is the material used for making the second printed-circuit board. When the second conducting path is disposed on a second surface of the first printed-circuit board, the dielectric material is the material used for making the first printed-circuit board.

By making use of an area of the printed-circuit board that is otherwise unused, the invention provides a low-inductance connection between two electrical components of a printed-circuit board without requiring an enlargement of the printed-circuit board. These and other features of the invention will be apparent from the following detailed description and the accompanying figures, in which:

DETAILED DESCRIPTION

Figure 1:
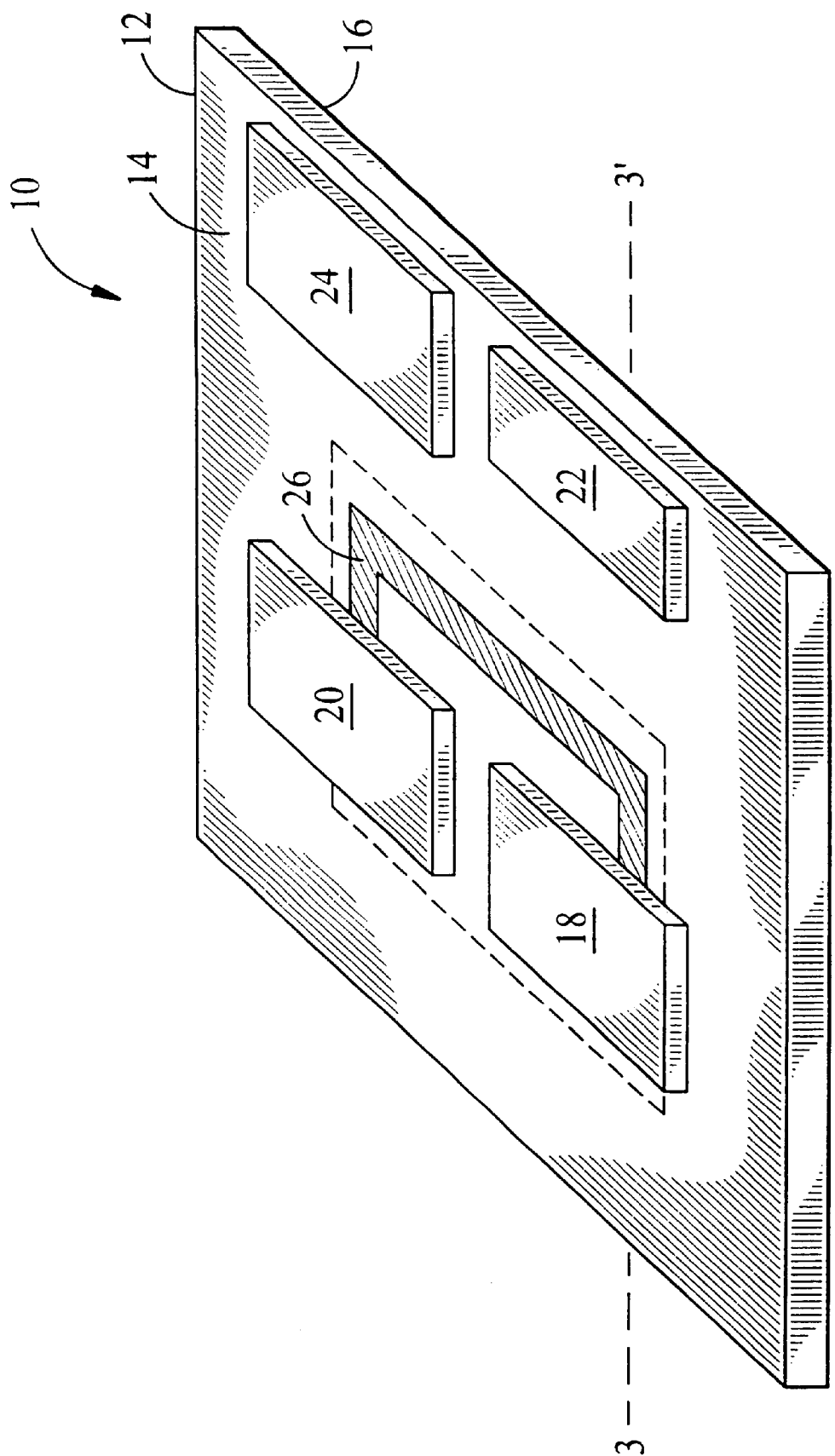
FIG. 1 shows a first printed-circuit board from a printed-circuit board assembly incorporating the low-inductance connection of the invention.

FIG. 1 shows a printed-circuit board assembly 10 having a first printed-circuit board 12 with a component surface 14 and a solder surface 16. On the component surface 14 are mounted a first component 18, a second component 20, and one or more neighboring components 22, 24. These components can be any kind of electrical or electronic components. The first component 18 is electrically connected to the second component 20 by a first conducting path 26. The length of the first conducting path 26 depends on the distance between the first and second components 18, 20. Its width is limited by the separation between the first and second components 18, 20 and the neighboring components 22, 24.

When current flows on the first conducting path 26, it generates a magnetic field surrounding that path. This magnetic field is manifested by a parasitic inductance associated with the first conducting path 26. The extent of this parasitic inductance depends in part on the current density. This current density, and hence the parasitic inductance, can be reduced by widening of the first conducting path 26, as shown in FIG. 2.

Figure 2:
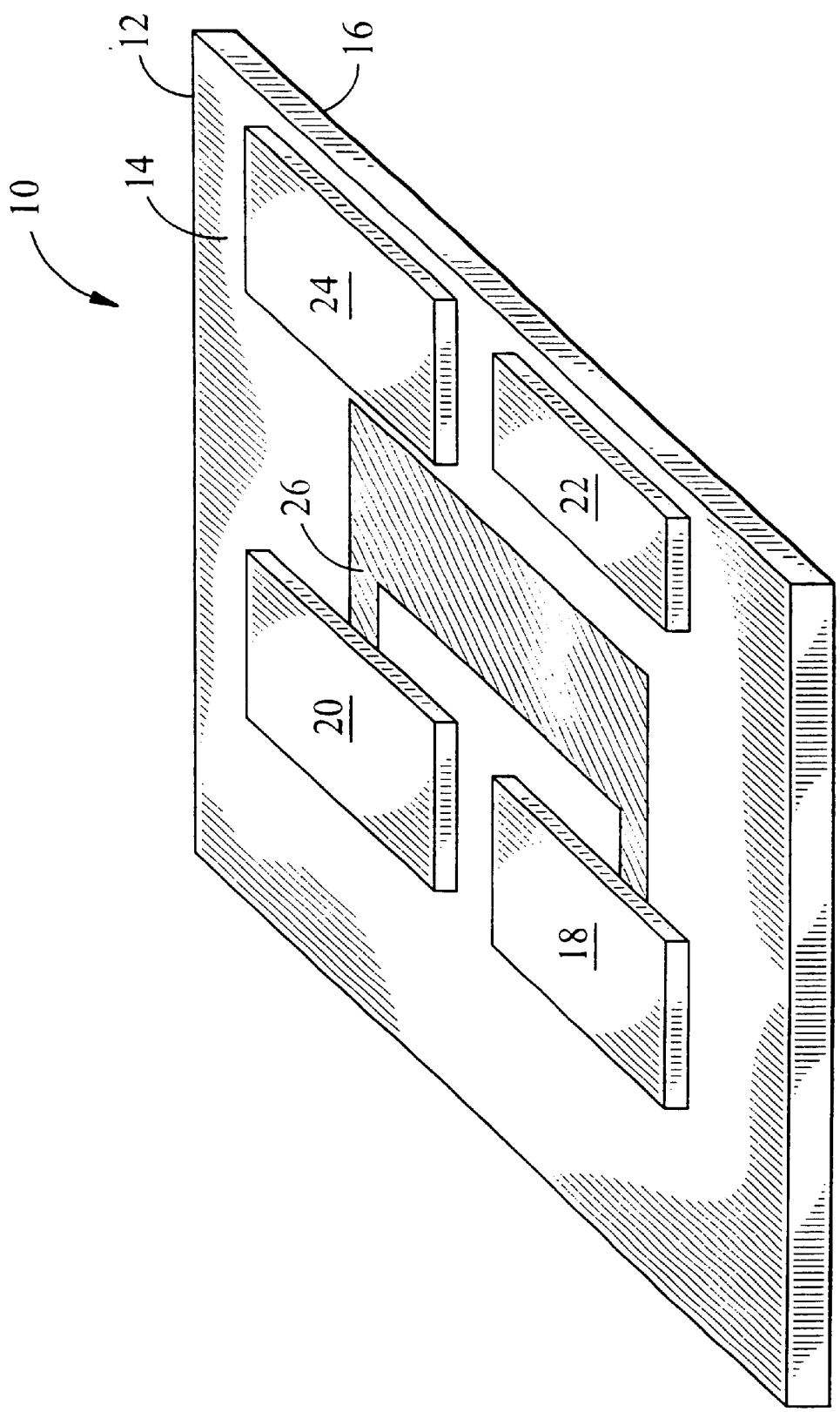
FIG. 2 shows a prior art structure for reducing the parasitic inductance of a connection between two components on a printed-circuit board.

However, as shown in FIG. 2, because of the proximity of neighboring components 22, 24 on the first printed-circuit board 12, there is a practical limit to how far one can widen the first conducting path 26. Beyond a limit that depends on the separation between components on the first printed-circuit board 12, it is no longer possible to widen the first conducting path 26 without also increasing the spacing between the components on the first printed-circuit board 12. This increases the overall size of the first printed-circuit board assembly 10, and hence its cost.

Figure 3:
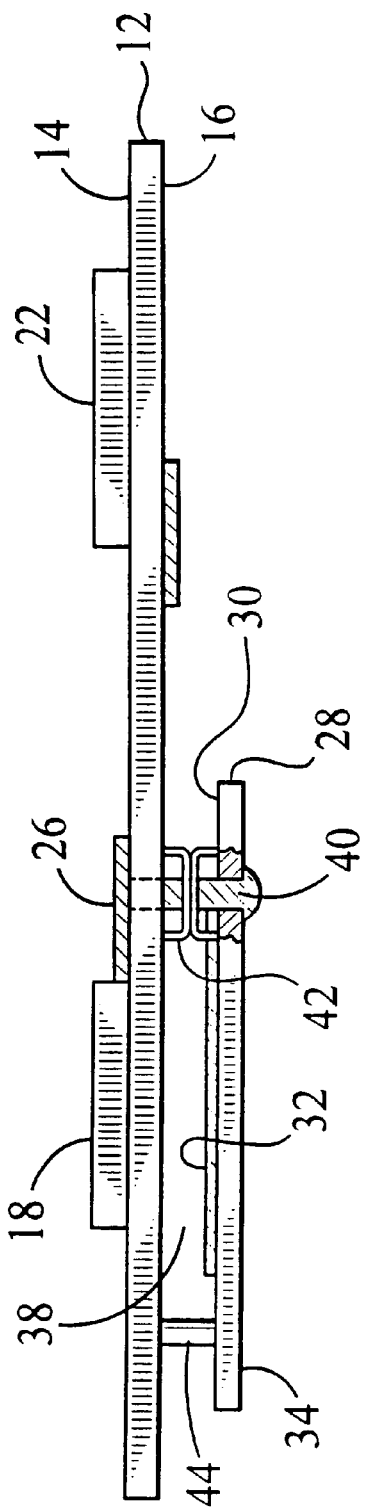
FIG. 3 is a cross-sectional view of the printed-circuit board assembly of FIG. 1 showing a second conducting path on a proximal surface of a second printedcircuit board.

A printed-circuit board assembly 10 employing the principles of the invention provides a second printed-circuit board 28, best seen in FIG. 3, that is disposed on a surface parallel to and spaced apart from the solder surface 16 of the first printed-circuit board 12. The second printed-circuit board 28 includes a proximal surface 30 that faces the first printed-circuit board 12 and a distal surface 34 opposite the proximal surface 30. In the embodiment of FIG. 3, a second conducting path 32 is disposed on the proximal surface 30 of the second printed-circuit board 28. In another embodiment, shown in FIG. 4, the second conducting path 32 is instead disposed on the distal surface 34.

Figure 4:
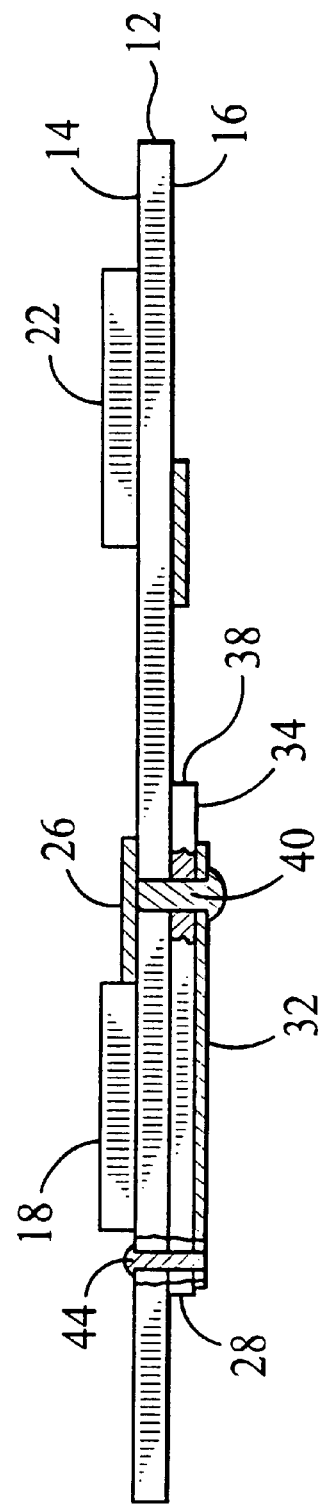
FIG. 4 is a cross-sectional view of the printed-circuit board assembly of FIG. 1 showing a second conducting path on a distal surface of a second printed-circuit board.
Figure 5:
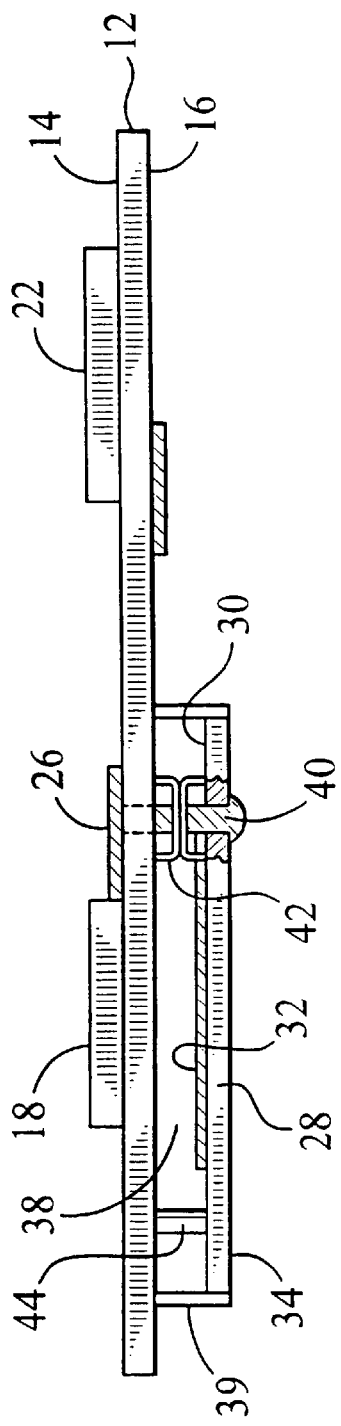
FIG. 5 is a cross-sectional view of the printed-circuit board assembly of FIG. 1 showing a gas-impermeable barrier forming a chamber between the first and second printed-circuit boards.

In both embodiments there exists a narrow insulating layer 38 between the first and second conducting paths 26, 32. This insulating layer 38 is preferably as small as possible while maintaining mandated safety standards. The separation can be reduced further by providing an insulating material other than air. For example, the insulating layer 38 can be a dielectric material or an insulating gas such as nitrogen or SF-6. Where an insulating gas forms the insulating layer 38, a gas-impermeable barrier 39 extending in a direction perpendicular to the first and second printed-circuit boards can be placed around the perimeter of the second printed-circuit board, as shown in FIG. 5. Such a barrier would result in the insulating layer 38 being a gas-filled chamber between the first and second printed-circuit boards.

Where the second conducting path 32 is disposed on the distal surface 34 of the second printed-circuit board 28, as shown in FIG.4 the first and second printed-circuit boards 12, 28 can in fact be in contact with each other. In this case, the material that constitutes the printed-circuit board 28 itself provides the dielectric material for the insulating layer 38.

The dotted line shown in FIG. 1 indicates the extent of the second conducting path 32. As shown in FIG. 1, the second conducting path 32 has a length similar to that of the first conducting path 26. However, the second conducting path 32 can be made much wider than the separation between the first and second components 18, 20 and the neighboring components. This is because the second conducting path 32 occupies space that is not used for placement of components and would otherwise be wasted.

In the embodiments of FIGS. 3–5, an electrical connector 40 extends through a hole in the second printed-circuit board 28 and into the first printed-circuit board 12 where it makes electrical contact with the first conducting path 26. The electrical connector 40 is also in electrical contact with the second conducting path 32. The electrical connector 40 can be a conducting member such as a conducting post, screw, or bolt, as shown in FIGS. 3 and 5. Alternatively, the electrical connector 40 can be a via, as shown in FIG. 4. The electrical connector 40 thus provides electrical communication between the first and second conducting paths 26, 32. This results in the parallel connection of the first and second conducting paths 26, 32 and the formation of an electrical connection between the first and second components 18, 20. The electrical connection thus formed has a parasitic inductance that is lower than the parasitic inductance of the first and second conducting paths 26, 32, as described below.

To provide additional mechanical stability, one or more optional supports 44 extend between the first and second printed-circuit boards 12, 28. These optional supports 44 assist in maintaining a constant separation between the first and second printed-circuit boards 12, 28 and bracing the first and second printed-circuit boards 12, 28 against any forces that may disturb their relative positions and orientations.

In the case of a gas-filled or air-filled insulating layer 38, a spacer 42 assists in maintaining the extent of the insulating layer 38 between the first and second conducting paths 26, 32. The extent of the insulating layer 38 can be controlled by selecting spacers of varying sizes. The spacer 42 can be a U-shaped structure, as shown in FIG. 3. However, a spacer 42 can also be a washer or any structure that can be penetrated by the conducting screw and be sufficiently rigid to maintain the required separation between the first and second conducting paths 26, 32.

The low-inductance connection of the invention reduces the parasitic inductance of a single conducting path 26 between two components by providing a second conducting path 32 between the two components. The parallel combination of the first and second conducting paths 26, 32 thus provides greater surface area for conduction of electric current, and hence lower current density. This reduces the parasitic inductance from that associated with only the first conducting path 26.

Figure 6:
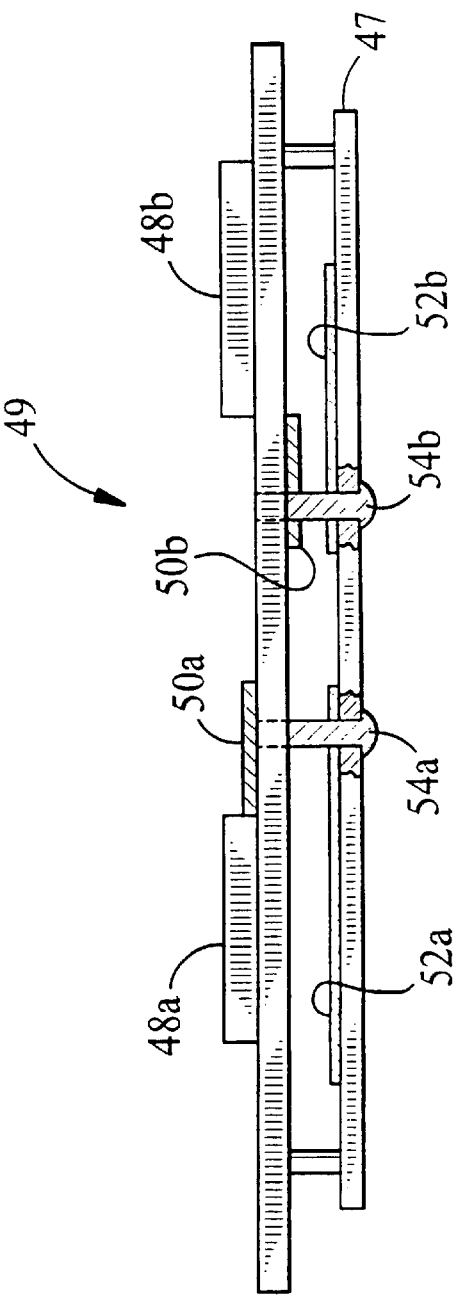
FIG. 6 is a cross-sectional view of a printed-circuit board component in which two pairs of electrical components are connected by two low-inductance connections of the type shown in FIG. 1.

As shown in FIG. 6, a single second printed-circuit board 47 can also be used to provide several low-inductance electrical connections. The illustrated printed-circuit assembly 49 in FIG. 6 has two first-electrical-components 48a–b and two second-electrical-components (hidden by the two first electrical components), each of which corresponds to one of the first electrical components 48a–b. Each of the second electrical components is disposed relative to its corresponding first electrical component 48a–b in the manner shown in FIG. 1.

Each pair of first and second electrical components is connected by a corresponding first conducting path 50a–b as shown in FIG. 1. In the embodiment of FIG. 6, the width of the second printed-circuit board 47 is sufficient to dispose a second conducting path 52a–b under each of the pairs of first and second electrical components. Each of the first conducting paths 50a–b is connected to its corresponding second conducting path 52a–b by a corresponding conducting screw 54a–b. FIG. 6 shows a printed-circuit board assembly 49 that incorporates multiple instances of the printed-circuit board assembly shown in FIG. 3 by providing multiple second conducting-paths on a second printed-circuit board. Note that as shown in FIG. 6, the first conducting paths 50a–b can be on either side of the first printed circuit board. Having been apprised of the embodiment of FIG. 6, it will be clear to one of ordinary skill in the art that multiple instances of the printed circuit board assemblies shown in FIGS. 4 and 5 can be constructed in a similar fashion.

Figure 7:
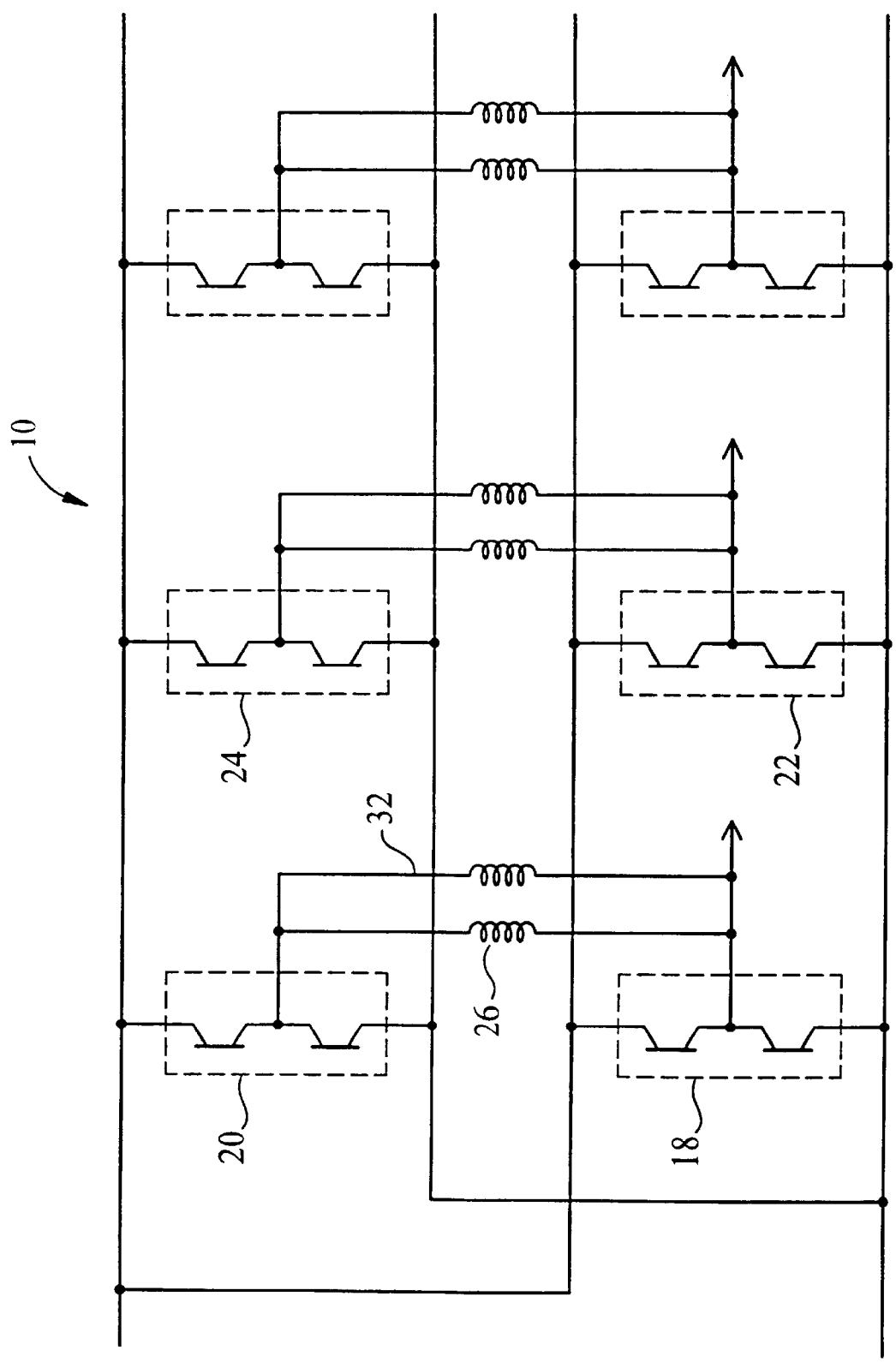
FIG. 7 is a schematic diagram of a portion of a printed-circuit assembly for a power-converter incorporating the low-inductance connection of the invention.

The low-inductance electrical connector of the invention is of particular utility in a printed-circuit board assembly 10 for a power-converter, a portion of which is shown schematically in FIG. 7. In the power-converter of FIG. 7, the first and second electrical components 18, 20 and the two neighboring components 22, 24 all correspond to transistor modules, each of which has an output carrying a pulse-width modulated current. To achieve higher power than can be provided by a single transistor module by itself, the outputs of pairs of transistor modules are combined by providing a first conducting path 26 to connect the first and second transistor modules. Because the first conducting path 26 carries such high current, the inductance of the first conducting path interferes with rapid switching. The inductance of the first conducting path 26 can be reduced by providing a second printed-circuit board mounted to the first printed-circuit board. This second printed-circuit board provides a second conducting-path 32 in accord with the principles of the invention. The first and second conducting paths 26, 32, being connected in parallel as shown in FIG. 7, collectively have a parasitic inductance that is lower than the parasitic inductance of either the first or second conducting path by itself.

Having described the invention and a preferred embodiment thereof, what I claim as new, and secured by Letters Patent is:

1. A low-inductance connection between a first component on a first printed-circuit board and a second component on the first printed-circuit board, the low-inductance connection comprising:
    a first conducting path disposed on a first surface of the first printed-circuit board and extending between the first component and the second component, the first conducting path having a first parasitic inductance; and
    a second conducting path disposed on a separate surface, the separate surface being separated from the first surface of the first printed-circuit board by an insulating layer having a selected thickness, the second conducting path being electrically connected to the first conducting path, the first and second conducting paths thereby forming an electrical connection having a second parasitic inductance that is less than the first parasitic inductance.

2. The low-inductance connection of claim 1, wherein the second conducting path is disposed on a second printed-circuit board attached to the first printed-circuit board.

3. The low-inductance connection of claim 2, wherein the separate surface is selected from the group consisting of:
    a distal surface of the second printed-circuit board; and
    a proximal surface of the second printed-circuit board.

4. The low-inductance connection of claim 1, wherein the separate surface is a second surface of the first printed-circuit board.

5. The low-inductance connection of claim 1, wherein the insulating layer is air.

6. The low-inductance connection of claim 1, wherein the insulating layer is an insulating gas.

7. The low-inductance connection of claim 1, wherein the insulating layer is a dielectric.

8. The low-inductance connection of claim 7, wherein the dielectric is a material used for making a second printed-circuit board.

9. The low-inductance connection of claim 7, wherein the dielectric is a material used for making the first printed-circuit board.

10. The low-inductance connection of claim 1, wherein the first conducting path has a first length and the second conducting path has a second length substantially equal to the first length.

11. The low-inductance connection of claim 2, further comprising at least one support extending between the first and second printed-circuit boards.

12. The low-inductance connection of claim 11, wherein the electrical connector is disposed proximate to a first edge of the first conducting path and the at least one support is disposed proximate to a second edge of the first conducting path, the second edge being opposite from the first edge.

13. The low-inductance connection of claim 2, wherein the second printed-circuit board has a proximal face that contacts the first printed-circuit board.

14. The low-inductance connection of claim 1, further comprising a conducting member bridging the insulating layer, the conducting member being in electrical communication with the first conducting path and the second conducting path.

15. The low-inductance connection of claim 1, further comprising a via bridging the insulating layer, the via being in electrical communication with the first conducting path and the second conducting path.

16. The low-inductance connection of claim 12, wherein the conducting member is selected from the group consisting of: a conducting post, a conducting screw, and a conducting bolt.

17. The low-inductance connection of claim 1, further comprising a spacer between the first and second conducting paths for maintaining the selected thickness of the insulating layer.

18. The low-inductance connection of claim 17, wherein the spacer is selected from a group consisting of a washer having a hole for receiving an electrical connector, and a U-shaped member having a space for receiving the electrical connector.

19. A method for electrically connecting a first component disposed on a first printed-circuit board and a second component disposed on the first printed-circuit board, the method comprising:
    extending a first conducting path along a first surface of the first printed-circuit board, the first conducting path extending between the first component and the second component and having a first parasitic inductance;
    providing a second conducting path disposed on a separate surface, the separate surface being separated from the first surface of the first printed-circuit board by an insulating layer having a selected thickness; and
    providing an electrical connection between the first conducting path and the second conducting path, thereby forming an electrical connection having a second parasitic inductance that is less than the first parasitic inductance.

20. The method of claim 19, wherein providing the second conducting path comprises disposing the second conducting path on a second printed-circuit board, the second printed-circuit board having a proximal surface and a distal surface.

21. The method of claim 20, wherein providing the second conducting path further comprises selecting the separate surface to be the distal surface of the second printed-circuit board.

22. The method of claim 20, wherein providing the second conducting path further comprises selecting the separate surface to be the proximal surface of the second printed-circuit board.

23. The method of claim 19, wherein providing the second conducting path comprises selecting the separate surface to be a second surface of the first printed-circuit board, the second surface being opposed to the first surface.

24. The method of claim 19, wherein providing the second conducting path further comprises selecting the insulating layer to be air.

25. The method of claim 19, wherein providing the second conducting path further comprises selecting the insulating layer to be an insulating gas.

26. The method of claim 19, wherein providing the second conducting path further comprises selecting the insulating layer to be a dielectric.

27. The method of claim 26, wherein selecting the insulating layer to be a dielectric comprises selecting the dielectric to be a material used for making a second printed-circuit board.

28. The method of claim 21, wherein selecting the insulating layer to be a dielectric comprises selecting the dielectric to be a material used for making the first printed-circuit board.

29. The method of claim 19, further comprising extending the second conducting path to have a length substantially equal to a length of the first conducing path.

30. The method of claim 20, further comprising supporting the first and second printed-circuit boards to maintain the selected thickness of the insulating layer.

31. The method of claim 20, further comprising contacting the proximal surface of the second printed-circuit board against the first printed-circuit board.

32. The method of claim 19, wherein electrically connecting the first conducting path to the second conducting path comprises bridging the insulating layer with a conducting member, the conducting member being in electrical communication with the first and second conducting paths.

33. The method of claim 32, wherein bridging the insulating layer comprises selecting the conducting member from a group consisting of a conducting post, a conducting screw, a conducting bolt, and a via.

34. The method of claim 19, further comprising providing a spacer between said first and second conducting paths for maintaining the selected thickness of the insulating layer.

35. A power converter comprising:
   a first component on a first surface of a first printed-circuit board;
   a second component on the first surface of the first printed-circuit board;
   a first conducting path disposed on the first surface of the first printed-circuit board and extending between the first component and the second component, the first conducting path having a first parasitic inductance; and
   a second conducting path disposed on a separate surface, the separate surface being separated from the first surface of the first printed-circuit board by an insulating layer having a selected thickness, the second conducting path being electrically connected to the first conducting path, the first and second conducting paths thereby forming an electrical connection having a second parasitic inductance that is less than the first parasitic inductance.

36. The power converter of claim 35, wherein the second conducting path is disposed on a second printed-circuit board.

37. The power converter of claim 36, wherein the separate surface is selected from the group consisting of:
   a distal surface of the second printed-circuit board; and
   a proximal surface of the second printed-circuit board.

38. The power converter of claim 35, wherein the separate surface is a second surface of the first printed-circuit board.

39. The power converter of claim 35, wherein the insulating layer is air.

40. The power converter of claim 35, wherein the insulating layer is an insulating gas.

41. The power converter of claim 35, wherein the insulating layer is a dielectric.

42. The power converter of claim 41, wherein the dielectric is a material used for making a second printed-circuit board.

43. The power-converter of claim 41, wherein the dielectric is a material used for making the first printed-circuit board.

44. The power converter of claim 35, wherein the first conducting path has a first length and the second conducting path has a second length substantially equal to the first length.

45. The power converter of claim 36, further comprising at least one support extending between the first and second printed-circuit boards.

46. The power converter of claim 45, wherein the electrical connector is disposed proximal to a first edge of the first conducting path and the at least one support is disposed proximal to a second edge of the first conducting path, the second edge being opposite from the first edge.

47. The power converter of claim 36, wherein the second printed-circuit board has a proximal face that contacts the first printed-circuit board.

48. The power converter of claim 35, further comprising a conducting member bridging the insulating layer, the conducting member being in electrical communication with the first conducting path and the second conducting path.

49. The power converter of claim 35, further comprising a spacer between the first and second conducting paths for maintaining the selected thickness of the insulating layer.

50. The power converter of claim 48, wherein the conducting member is selected from the group consisting of a conducting post, a conducting bolt, a conducting screw, and a via.

51. The power converter of claim 49, wherein the spacer is selected from a group consisting of a washer having a hole for receiving an electrical connector, and a U-shaped member having a space for receiving the electrical connector.

52. The power converter of claim 35, wherein the first component is a transistor module.

* * * * *